United States Patent
Doyle et al.

(10) Patent No.: US 10,340,182 B2
(45) Date of Patent: Jul. 2, 2019

(54) ENHANCED VIA FILL MATERIAL AND PROCESSING FOR DUAL DAMSCENE INTEGRATION

(71) Applicant: International Business Machines Corporation, Armonk, NY (US)

(72) Inventors: James P. Doyle, Armonk, NY (US); Geraud Dubois, Armonk, NY (US); Nicholas C. Fuller, Armonk, NY (US); Teddie P. Magbitang, Armonk, NY (US); Robert D. Miller, Armonk, NY (US); Sampath Purushothaman, Armonk, NY (US); Willi Volksen, Armonk, NY (US)

(73) Assignee: International Business Machines corporation, Armonk, NY (US)

( * ) Notice: Subject to any disclaimer, the term of this patent is extended or adjusted under 35 U.S.C. 154(b) by 131 days.

(21) Appl. No.: 14/953,466

(22) Filed: Nov. 30, 2015

(65) Prior Publication Data

US 2017/0154812 A1 Jun. 1, 2017

(51) Int. Cl.
*H01L 21/768* (2006.01)
*H01L 23/522* (2006.01)
(Continued)

(52) U.S. Cl.
CPC .. *H01L 21/76835* (2013.01); *H01L 21/31144* (2013.01); *H01L 21/76808* (2013.01);
(Continued)

(58) Field of Classification Search
CPC ......... H01L 21/76835; H01L 21/76811; H01L 23/5226; H01L 23/53295; H01L 21/76877
See application file for complete search history.

(56) References Cited

U.S. PATENT DOCUMENTS 6,204,456 B1 3/2001 Lauffer et al. ............... 174/262
6,391,472 B1 5/2002 Lamb, III et al. ........... 428/624
(Continued)

OTHER PUBLICATIONS

J. D. Adolf et al., "Novel High Molecular Weight Levelers Extending Gap Fill to Smaller Features," ECS Transactions, vol. 16, No. 22, 2009, 2009, pp. 1-10.

(Continued)

*Primary Examiner* — Mohammed R Alam
(74) *Attorney, Agent, or Firm* — The Law Offices of Robert J. Eichelburg

(57) ABSTRACT

A process comprises insulating a porous low k substrate with an organic polymer coating where the polymer does not penetrate or substantially penetrate the pores of the substrate, e.g., pores having a pore diameter of about one nm to about 5 nm, thereby completely or substantially mitigating the potential for capacitance increase of the substrate. The substrate comprises porous microcircuit substrate materials with surface pores optionally opening into subsurface pores. The organic polymer has a molecular weight greater than about 5,000 to greater than about 10,000 and a glass transition temperature greater than about 200° C. up to about the processing temperature required for forming the imaging layer and antireflective layer in a microcircuit, e.g., greater than about 225° C. The invention includes production of a product by this process and an article of manufacture embodying these features.

20 Claims, 4 Drawing Sheets

(51) Int. Cl.
*H01L 23/532* (2006.01)
*H01L 21/311* (2006.01)

(52) U.S. Cl.
CPC .. *H01L 21/76811* (2013.01); *H01L 21/76877* (2013.01); *H01L 23/5226* (2013.01); *H01L 23/53295* (2013.01)

(56) References Cited

U.S. PATENT DOCUMENTS

| | | | |
|---|---|---|---|
| 6,521,542 B1 | 2/2003 | Armacost et al. | 438/712 |
| 6,630,520 B1 | 10/2003 | Bruza et al. | 521/77 |
| 7,585,612 B2 | 9/2009 | Thackeray et al. | 430/271.1 |
| 7,745,540 B2 | 6/2010 | Devadoss et al. | 525/326.1 |
| 2006/0058487 A1* | 3/2006 | Rantala | C08G 77/50 528/33 |
| 2006/0068335 A1 | 3/2006 | Coley et al. | 430/33 |
| 2013/0017688 A1* | 1/2013 | Dubois | H01L 21/3105 438/759 |
| 2015/0187670 A1* | 7/2015 | Ono | H01L 21/02063 257/741 |
| 2016/0307793 A1* | 10/2016 | Huang | H01L 21/76879 |
| 2017/0331094 A1* | 11/2017 | Lee | H01M 2/14 |

OTHER PUBLICATIONS

J. Zhou et al., "Impact of Leveler Molecular Weight and Concentration on Damascene Copper Electroplating," ECS Transactions, vol. 2, No. 6, 2007, pp. 77-92.

S. Takei et al., Characterization of Gap Fill Materials for Planarizing Substrate in Via-First Dual Damascene Lithography Process, Jap. J. of Appl. Phys., vol. 46, No. 9A, 2.

* cited by examiner

ENHANCED VIA FILL MATERIAL AND PROCESSING FOR DUAL DAMASCENE INTEGRATION

DESCRIPTION OF THE INVENTION

Field of the Invention

This invention relates to microcircuit structures and methods for forming such structures and more particularly to structures having recesses such as dual damascene recesses that include vias, in porous low K dielectrics which are coated with polymer compounds or compositions.

Background of the Invention

The advancement of semiconductor computational speed has largely been driven by the ever smaller dimensions of semiconductor transistors and other integrated circuit (IC) components.

In the early stages of manufacture, fabricators employed separate patterning steps to create pre-existing patterns on a semiconductor substrate followed by placing a self-assembled film over the patterns. (See, Black, C. T., et al. "Integration of Self-Assembled diblock Copolymers for Semiconductor Fabrication," Applied Physics Letters 79 400-411 (2001)). Attempts by manufacturers to combine such patterning steps resulted in smaller dimensions of integrated circuits (IC's) leading to the reduction in size of IC interconnects or wiring interconnects which led to the development of the dual damascene (DD) process.

In a "trench first" dual damascene process, the trenches are formed before the vias. Here, via lithography is a major challenge, because the vias have to be printed into the topology of the trenches. Reflection from the sidewalls of the trenches makes it difficult to accurately define the vias. Also, the trenches make it difficult to evenly spin on an anti-reflective coating (ARC) and photoresist. The resist thickness varies depending on the trench topology. Therefore, the lithographic definition of the vias is done with a non-uniform photoresist thickness, resulting in a very small process window. For optimal planarization of the resist, manufacturers employ a dummy structure, i.e., "white space fill" to improve photoresist thickness uniformity by preventing the photoresist from being thinned too much by being stretched too far between device features.

White space fill has the disadvantage of reducing the area available for device formation, thereby creating design constraints. Fabrication of interconnects by the dual damascene process comprises deposition of a dielectric layer, typically an oxide layer, over circuitry formed in a single crystal body, e.g., silicon. The oxide layer is etched to form a trench having a pattern corresponding to a pattern of vias and wires for interconnection of elements of the circuitry. Vias are openings in the oxide through which different layers of the structure are electrically interconnected, and the pattern of the wires is defined by trenches in the oxide. Metal is then deposited to fill the openings in the oxide layer. Subsequently, excess metal is removed by polishing. The process is repeated as many times as necessary to form the required interconnections. The dual damascene structure produced has a trench in an upper portion of a dielectric layer and a via terminating at the bottom of bottom of the trench and passing through a lower portion of the dielectric layer. The structure also has a step between the bottom of the trench and a sidewall of the via, at the bottom of the trench.

In the standard approach, i.e., the "via first" approach, the vias are etched into the oxide first, before the trenches are formed. Both types of openings (i.e., the vias and the trenches) are typically formed by using an anisotropic, or dry etch, such as a reactive ion etch (RIE). The subsequent trench RIE, however, produces oxide fences at the trench/via interface, with the fences having the shape of upright rails. The fences are formed because of the use of an anti-reflective coating required for deep ultraviolet (DUV) lithography of trenches with use of polymerizing oxide trench etch. The ARC is necessary to control reflectivity variations caused by the topography from previous processing. The ARC is also required as a protection against RIE attack of underlying films. Since the ARC and photoresist polymers adhere to the bottom of the via opening during the trench lithography step, these polymers act as a mask during the etching of the oxide in the trench formation step, creating fences if the oxide etch is too selective to the ARC. One can also use an oxide etch process with lesser selectivity to polymers, but this leads to critical dimension (CD) loss.

The fences are not easily covered by subsequent metallization layers, which cause problems with liner and metal fill instability. Fences therefore often cause yield degradation in a dual damascene metallization fabricated with the "via first" approach. More specifically, fences reduce reliability due to electromigration of metal, with early failure of metal lines. This electromigration is induced by metal not completely covering the fences, thereby creating breaks in the metal. Deposition of the metal by chemical vapor deposition (CVD) can prevent these breaks. However, the latter is undesirable because of the expense entailed. Manufacturers use hard mask lithography/etch as an alternative to photoresist for trench definition to avoid fence formation, a complex process having its own challenges.

Further, in the "trench first" approach, ARC cannot readily be used for via definition with a standard lithography scheme. Because ARC provides non-conformal coverage over the corners of the trench, extremely high resist selectivity would be required during the via etch. Failure to obtain high resist selectivity results in critical dimension (CD) loss and device failure. For satisfactory printing of sub-0.5 Tm via patterns without ARC, fabricators use DUV technology with an advanced DUV stepper. An example of such a stepper is the commercially available Micrascan III (manufactured by Silicon Valley Group, San Jose, Calif. 95110). With this procedure, however, the process window of the via lithography becomes very narrow in terms of DUV parameters. The thickness of the resist varies depending on trench topology. Therefore, a range of optimal focus/exposure conditions exists across any wafer manufacturing process. Since only one condition can be chosen, this creates a very small process window, as the focus range for successful via exposure is smaller than that allowed within a manufacturing process. Further, the extendability of the approach to via diameters of less than 250 nm is uncertain, because even with advanced stepper tools, performance of the via lithography is threatened by notching of features or scumming of trenches due to challenges presented by the topology with trenches.

As with any circuit, chips are prone to signal propagation which varies with the product of the line resistivity, R, of the chip's interconnector wires where R refers to the resistivity of the wiring in the Dual Damascene component, and interlayer dielectric (ILD) capacitance, C. The common terminology used to classify dielectric films falls into four categories: standard k ($4.5 < k < 10$), low k ($k < 3.0$), ultra low k or ULK ($k < 2.5$), and extreme low k ($k < 2.0$). Ultra low k and extreme low k dielectrics generally tend to be porous with intentionally engineered voids in their structure since the lowest dielectric constant possible comprises air or vacuum ($k_{vac} = 1$).

An increase in the product of line resistance multiplied by ILD capacitance reduces the likelihood of signal propagation and vice-versa. Fabricators improved the performance of semiconductor chips, by reducing resistivity (R) of the interconnector wires by replacing aluminum wiring with copper, and employing low dielectric constant (k) materials for the ILD, resulting in a reduction of the capacitance, C sometimes referred to as parasitic capacitance.

This brought about the placement of low dielectric constant (k) films of organic polymers in the circuit(s) to minimize or substantially eliminate unwanted signal propagation, sometimes referred to as "cross-talk." Reduced dielectric constant (k) films also enable faster switching speeds, lower dynamic power consumption, lower heating in integrated circuits, a reduced likelihood or chance of spurious switching of critical circuits resulting in failure in circuits, and reduction of electro migration in integrated circuits.

The dual damascene process typically involves etching the contact and via holes to completion prior to the trench etching. Trench etching exposes the bottom and sidewalls, generally composed of the insulating or dielectric layer of the contact or via holes, to over-etch which can deteriorate contact with the base layer. An organic material partially or completely fills the via or contact holes and protects the bottom and sidewalls from further etch attack which can also serve as an ARC to reduce or eliminate pattern degradation and linewidth variation in patterning the trench layer, provided the fill material covers the surface of the dielectric layer.

High optical density organic polymer fill materials exposed at typical wavelengths have limited fill properties in that applying them to via or contact holes they tend to be quite thin on the substrate surface immediately adjacent the holes, leading to undesirable light reflection during subsequent exposure steps.

Other problems occur with High optical density organic polymer fill materials. Porous microcircuit substrates, such as silica contain air voids that provide low capacitance structures in the device, and penetrating and filling these voids with a via fill organic polymer displaces the air substantially, thereby minimizing the voids or eliminating them, with a consequent increase in the overall capacitance of the circuit. This causes any combination of disadvantages, e.g., "cross-talk," lower switching speeds, higher dynamic power consumption, higher heating, an increased likelihood or chance of spurious switching, and an increase in electro migration in the microcircuits.

While all of the foregoing provides advancements in the fabrication of semiconductor chips, arrays, wafers, and IC structures, referred to hereafter as a microcircuit or microcircuits, there is still a need to improve them by means of novel or improved processes.

Related Art

The following references relate to the state of the art in the field of forming microcircuit structures with recesses such as dual damascene recesses including vias, and recess fill or via fill compositions.

Armacost, et al., U.S. Pat. No. 6,521,542, "Method for Forming Dual Damascene Structure;"

Breyta, et al., U.S. Pat. No. 7,790,350, "Method And Materials For Patterning a Neutral Surface;"

Bruza, et al., U.S. Pat. No. 6,630,520, "Composition Containing a Cross-Linkable Matrix Precursor and a Poragen, and a Porous Matrix Prepared Therefrom;"

Coley, et al., U.S. Patent Application 20060068335, "Coating Compositions for Use With an Overcoated Photoresist;"

Devadoss, et al., U.S. Pat. No. 7,745,540, "Gap Fill Materials and Bottom Anti-Reflective Coatings Comprising Hyperbranched Polymers;"

Lamb, III, et al., U.S. Pat. No. 6,391,472, "Fill Material for Dual Damascene Processes;"

Lauffer, et al., U.S. Pat. No. 6,204,456, "Filling Open Through Holes in a Multilayer Board;"

Thackeray, et al., U.S. Pat. No. 7,585,612, "Coating Compositions for Use With an Overcoated Photoresist;"

Zhang, U.S. Patent Application 20150097289, "Hybrid Photonic and Electronic Integrated Circuits;"

J. D. Adolf et al., "Novel High Molecular Weight Levelers Extending Gap Fill to Smaller Features," ECS Transactions, Vol. 16, no. 22, 2009, 2009, pp. 1-10;

J. Zhou et al., "Impact of Leveler Molecular Weight and Concentration on Damascene Copper Electroplating," ECS Transactions, Vol. 2, no. 6, 2007, pp. 77-92; and Takei et al., "Characterization of Gap Fill Materials for Planarizing Substrate in Via-First Dual Damascene Lithography Process," Jap. J. of Appl. Phys., Vol. 46, No. 9A, 2007, pp. 5755-5761.

SUMMARY OF THE INVENTION

The present invention provides structures, articles of manufacture and processes that address these needs, and products produced by these processes that not only provide advantages over the related art, but also to substantially obviate one or more of the foregoing and other limitations and disadvantages of the related art. Not only do the written description, claims, abstract of the disclosure, and the drawings, that follow set forth various features, objectives and advantages of the invention and how they may be realized and obtained, but these features, objectives and advantages of the invention will also become apparent by practicing the invention.

To achieve these and other advantages, and in accordance with the purpose of the invention as embodied and broadly described herein, the invention comprises the discovery that a microcircuit via fill organic polymer having a low dielectric constant (K) and that does not penetrate or substantially penetrate porous microcircuit substrates, reduces or substantially eliminates unwanted capacitance in the microcircuit.

We provide an optimal polymer material for use as a sacrificial via fill organic planarization layer (OPL) in dual damascene lithography and etching processes to produce trench/via patterns in porous low k dielectrics by tailoring the molecular weight and glass transition temperature ranges of the polymer or polymer precursor such that the polymer's gap fill and planarization functions are achieved satisfactorily when filled into etched via features where the polymer does not penetrate into the porous low k dielectric through surface connected pores which may be exposed in the patterned via side walls. The polymer fills and planarizes the via openings in the substrate porous dielectric for lithographic processing. However, we select the molecular weight of the polymer so that the polymer does not penetrate into the pores of the substrate porous dielectric. The via openings are usually on the order of 20 nm or more as compared to the size of the pores in the substrate which are about an order of magnitude smaller. Hence the polymer that fills the larger diameter vias can be engineered not to fill the smaller diameter pores.

The process of the present invention and the article of manufacture obtained from the process address the increase in dielectric constant due to the OPL penetration of the pores and substantially eliminates or substantially reduces "crosstalk" and brings about faster switching speeds, lower dynamic power consumption, lower heating, a reduced likelihood or chance of spurious switching, and reduction of electromigration in the microcircuits. In addition, the invention substantially reduces or substantially eliminates any polymer infiltrated and trapped in the pores that causes trapped polymer outgasing, induces local delamination as well as degradation of adhesion of metal features later to be filled into the vias.

BRIEF DESCRIPTION OF THE DRAWINGS

The accompanying drawing is not necessarily drawn to scale but nonetheless sets out the invention, and is included to illustrate various embodiments of the invention, and together with this specification also serves to explain the principles of the invention. The drawings comprise FIGS. 1-4 side elevations in cross-section that illustrates structures obtained by the method of the invention.

DETAILED DESCRIPTION

Figure 1:
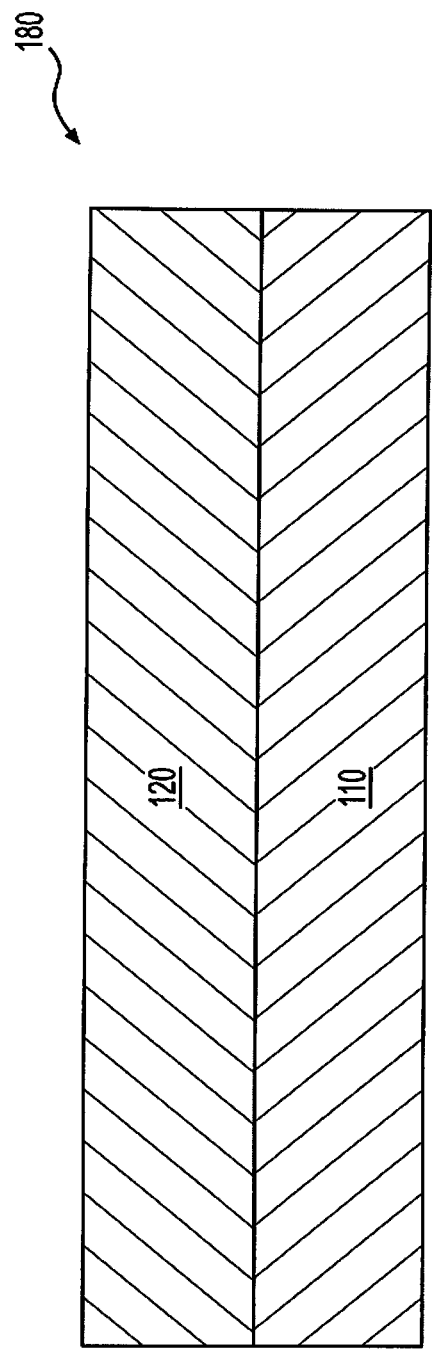

To achieve these and other advantages, and in accordance with the purpose of this invention as embodied and broadly described herein, the following detailed embodiments comprise disclosed examples that can be embodied in various forms. The specific processes and structural details set out comprise a basis for the claims and a basis for teaching one skilled in the art to employ the present invention in any novel and useful way. The terms, phrases and Figures also set out herein provide a description of how to make and use this invention. One having ordinary skill in the relevant art, once aware of the present disclosure, could employ suitable processes and structures without undue experimentation.

In one aspect, the invention comprises a method for forming dual damascene patterns in an insulating a porous substrate wherein a sacrificial organic gap polymer is used in the process to coat etched features in the substrate while the said polymer does not penetrate the pores in the low k substrate. Thus the potential for capacitance increase of the substrate due to polymer infiltration and retention in the porous substrate is completely or substantially mitigated. The sacrificial organic gap polymer is also referred to in the related art as an organic planarizing layer (OPL) and may serve as an ARC layer as well as a planarizing layer which helps enhance the lithographic process window when patterning is performed in substrates with previously patterned and etched structures (e.g. via openings) when filled with the OPL.

Kirk Othmer, *Encyclopedia of Chemical Technology*, $2^{nd}$ Edition disclose an array of suitable polymer materials under the entry "Polymers" that can be used as the organic polymers employed in the process of the invention and the products and articles of manufacture of the invention as do the related art references cited herein and those polymers set out in Aldrich, *Handbook of Fine Chemicals, pp.* 1994-2007 (2007-2008) all of which we incorporate herein by reference in their entirety. The polymers of the invention comprise polymer compounds and polymer compositions, i.e., polymers formulated with additional compounds such as stabilizers, plasticizers, pigments and the like, including any combination thereof, all as known in the art.

"Low K" as used herein refers to k (k<3.0), ultra low k or "ULK" (k<2.5), and extreme low k (k<2.0). These values for "K," however, can vary by about plus or minus ~10%, or about plus or minus ~20% or about plus or minus ~30%. In one embodiment, we employ "ULK" polymers.

We employ a polymer having a number average molecular weight of greater than about 5,000 to greater than about 10,000 and a glass transition temperature above the processing temperature required for the imaging layer and the antireflective layer used in fabricating a microcircuit. These glass transition temperatures generally fall in the range of greater than about 200° C. to greater than about 225° C.

We coat the porous substrate with a polymer having the properties described above to preclude penetration of the polymer into the pores of the substrate. Precluding the polymer from penetration means substantially precluding penetration, or negligible penetration, or a complete absence of penetration, all falling within the limits of the methods used for making this measurement. Again, we select the polymer or polymer precursor such that the polymer's gap fill and planarization functions when filled into etched via features where the polymer does not penetrate into the porous low k dielectric through surface connected pores which may be exposed in the patterned via side walls. The polymer fills and planarizes the via openings in the substrate porous dielectric for lithographic processing. However, we select the molecular weight of the polymer so that the polymer does not penetrate into the pores of the substrate porous dielectric. The via openings are usually on the order of 20 nm or more as compared to the size of the pores in the substrate which are about an order of magnitude smaller. Hence the polymer that fills the larger diameter vias can be engineered not to fill the smaller diameter pores.

The polymer is dissolved in a solvent, such as an organic solvent, subsequently removed from the coated material by heating, e.g., at about room temperature or above, by which we mean about 20° C. or above, or by applying a vacuum to the coated material or both heating and application of a vacuum.

Organic solvents used in this respect comprise organic solvents known in the art.

Alternatively, the polymer comprises a room temperature dispersion of particulate polymeric material in an organic liquid, such as a solvent, i.e., an organosol. The solvent of the organosol is also selected so that it can be removed by heating and/or vacuum as described above.

The porous substrate is composed of a porous microcircuit substrate material with surface pores optionally opening into subsurface pores. We intend this description to include those substrates having pores extending substantially from the surface to a level slightly below the surface, or pores extending substantially from the surface to a level slightly below the surface and then interconnecting with pores below the surface level.

The microcircuit material in one embodiment comprises silica, however may also comprise organosilanes, carbosilanes, such as oxycarbosilane, organosilicate including methylsilsesquioxane, hydrogen silsesquioxane, silsesquioxisialnes, thermosetting organic polymers such as SiLK, polyarylene, polymerized multifunctional acetylenes, polyarylene ethers, cyclotene, polynorbornenes and/or mixtures thereof and the like.

The substrate materials comprise a porous region having a pore diameter of about one nm to about 5 nm and a pore volume of from about 10% to about 40% of the volume of the substrate material. Selection of the polymer as described herein precludes penetration of the polymer into this porous region.

The invention also includes a product made by the foregoing process that embodies the features disclosed as well as additional inventive features obtained by this process. In addition to the foregoing product by process, the invention includes an article of manufacture. Both the product by process and the article of manufacture comprise a polymer coated porous substrate where the polymer does not penetrate pores having a pore diameter of about one nm to about 5 nm in the substrate, such as a low k substrate thereby completely or substantially mitigating the potential for capacitance increase of the substrate due to polymer infiltration and retention in the porous substrate.

Again, the coating comprises an organic polymer on the porous substrate, the polymer having a molecular weight of greater than about 5,000 to greater than about 10,000 and a glass transition temperature greater than the processing temperature required for forming an imaging layer and antireflective layer in a microcircuit. In one embodiment the polymer has a glass transition temperature greater than about 200° C. to about greater than about 225° C. The polymer may be either a thermoplastic or thermosetting polymer although in the latter, the precursor polymer in one embodiment should be of high enough molecular weight to preclude pore penetration. The porous substrate comprises a porous microcircuit substrate material with surface pores optionally opening into subsurface pores, and we select the organic polymer to eliminate or minimize penetration of the polymer into substrate pores having a pore diameter of about one nm to about 5 nm pores so that these pores are substantially free of the polymer, all as described above.

Figure 2:
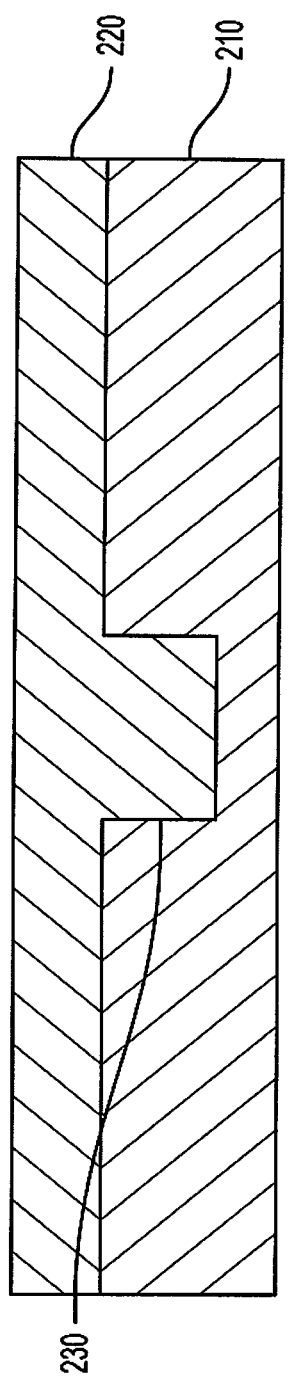
Figure 3:
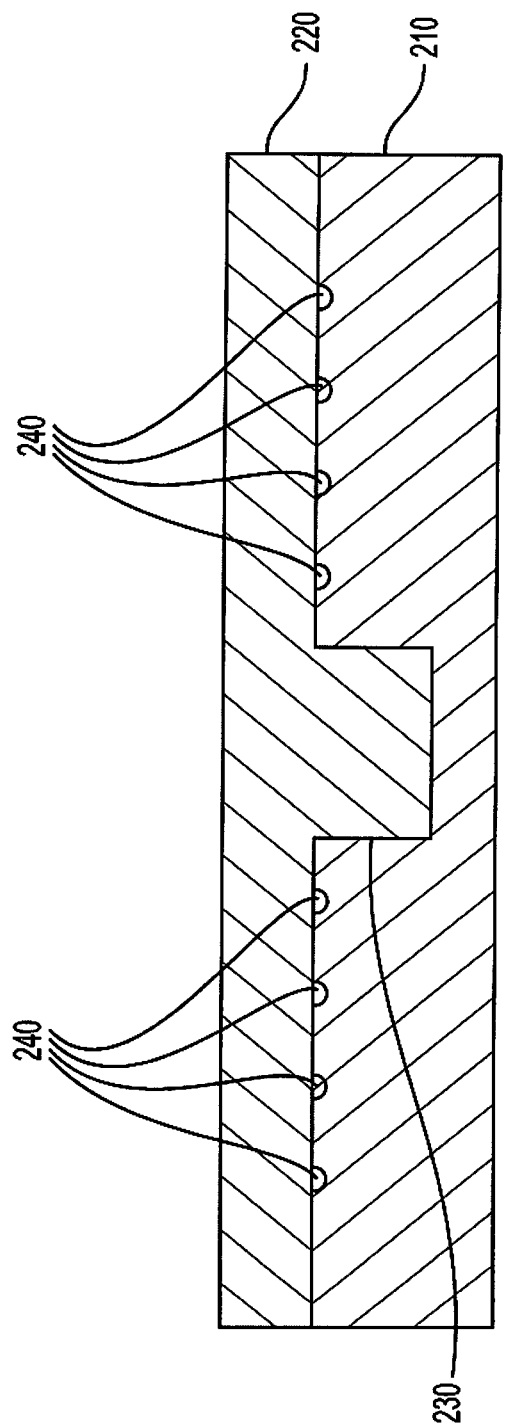
Figure 4:
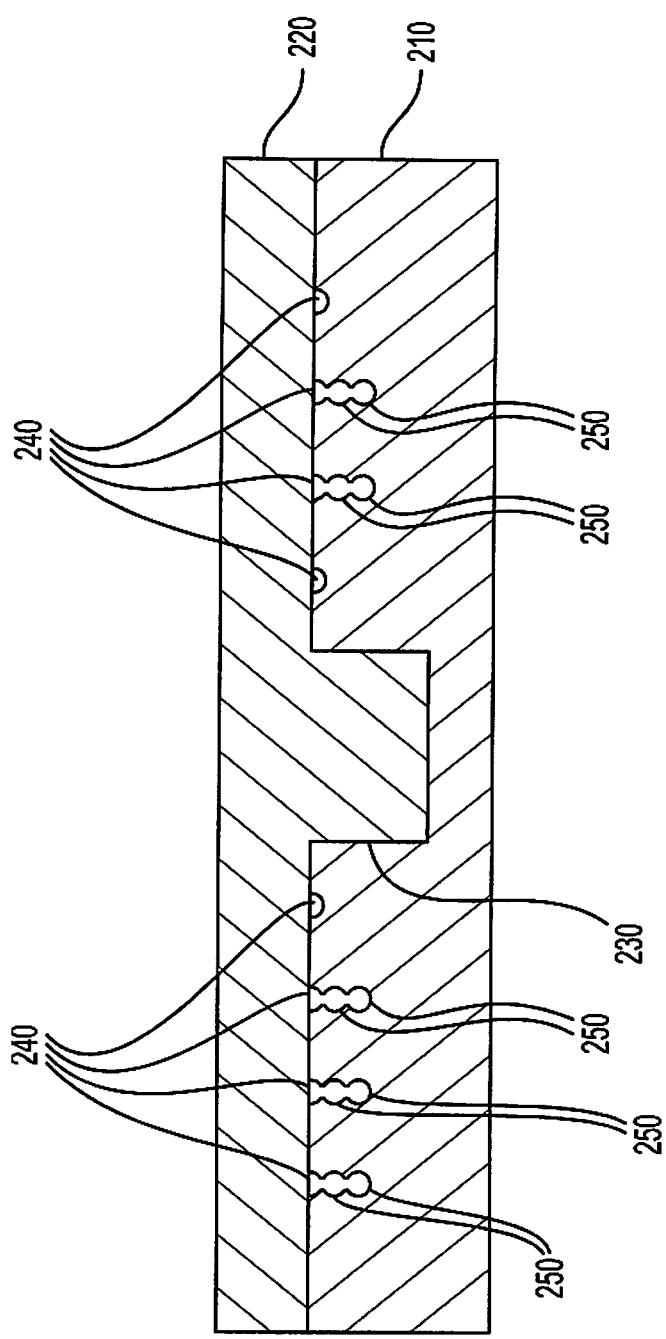

In the drawings, FIG. 1 illustrates a side elevation in cross-section 180 of a product produced by the process of the invention and an article of manufacture of the invention having a microcircuit substrate 110 and a polymer coating 120 all as described above. FIG. 2 illustrates a side elevation in cross section of another product produced by the process of the invention and an article of manufacture of the invention having a microcircuit substrate 210, a polymer coating 220 and a via opening 230, etched in porous substrate 210, with polymer coating 220 filling the via opening 230, and providing a planar top structure with a polymer of the invention filling the via opening 230, all as described above. FIG. 3 illustrates a side elevation in cross section of another product produced by the process of the invention and an article of manufacture of the invention having a microcircuit substrate 210, a polymer coating 220 a via opening 230, etched in porous substrate 210, having surface pores 240 with polymer coating 220 filling the via opening 230, and providing a planar top structure with a polymer of the invention filling the via opening 230. FIG. 4 illustrates a side elevation in cross section of another product produced by the process of the invention and an article of manufacture of the invention having a microcircuit substrate 210, a polymer coating 220 a via opening 230, etched in porous substrate 210, having surface pores 240 some of said surface pores 240 connected to subsurface pores 250, with polymer coating 220 filling the via opening 230, and providing a planar top structure with a polymer of the invention filling the via opening 230.

Various embodiments of our invention also comprise inter alia a process for coating a porous substrate with an organic polymer, where the porous substrate is composed of a porous microcircuit substrate material with surface pores optionally opening into subsurface pores, wherein the coating the porous substrate with the polymer is performed so as to eliminate or minimize penetration of the polymer into the surface pores and the subsurface pores by applying a coating comprising the polymer to the surface of the porous substrate where the polymer has a molecular weight of greater than about 5,000 and a glass transition temperature greater than a processing temperature required for forming an imaging layer and antireflective layer in the microcircuit. This process may also include embodiments:
   a. wherein the polymer has a glass transition temperature greater than about 200° C.;
   b. wherein the porous microcircuit substrate material comprises silica;
   c. wherein a product is made by the process;
   d. wherein the substrate material includes pores having a pore diameter of about 1 nm to about 5 nm and wherein the coating the porous substrate with the polymer is performed so as to eliminate or minimize penetration of the polymer into the pores having a pore diameter of about 1 to about 5 nm;
   e. wherein the polymer has a molecular weight of greater than about 10,000.
   f. wherein the polymer has a molecular weight of greater than about 5000 to about 10,000.
   g. wherein the polymer has a glass transition temperature greater than about 225° C., and;
   h. wherein the polymer has a glass transition temperature greater than about 200° C. to about 225° C.

Throughout this specification, abstract of the disclosure, claims, and in the drawings the inventors have set out equivalents, including without limitation, equivalent elements, materials, compounds, compositions, conditions, processes, structures, and even though set out individually, also include combinations of these equivalents such as the two component, three component, or four component combinations, or more as well as combinations of such equivalent elements, materials, compounds, compositions conditions, processes, structures in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five percent, ten percent, 15 percent, or 20 percent, or somewhat higher or lower than the upper limit of five percent, ten per-cent, 15 percent, or 20 percent. The term "up to" that defines numerical parameters means a lower limit comprising zero or a miniscule number, e.g., 0.001.

The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, and if not specifically stated herein, the written description, specification, claims, drawings, and abstract of the disclosure as subsequently amended.

All scientific journal articles and other articles, including Internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A process comprising coating a porous substrate with an organic polymer, where said porous substrate is composed of a porous microcircuit substrate material with surface pores optionally opening into subsurface pores, wherein said coating said porous substrate with said polymer is performed so as to eliminate or minimize penetration of said polymer into said surface pores and said subsurface pores by applying a coating comprising said polymer to the surface of said porous substrate where said polymer has a molecular weight of greater than about 5,000 and a glass transition temperature greater than a processing temperature required for forming an imaging layer and antireflective layer in said microcircuit.

2. The process of claim 1 wherein said polymer has a glass transition temperature greater than about 200° C.

3. The process of claim 1 wherein said porous microcircuit substrate material comprises silica.

4. The process of claim 2 wherein said porous microcircuit substrate material comprises silica.

5. A product made by the process of claim 1.

6. A product made by the process of claim 2.

7. A product made by the process of claim 3.

8. A product made by the process of claim 4.

9. The process of claim 1 wherein said substrate material includes pores having a pore diameter of about one nm to about 5 nm and wherein said coating said porous substrate with said polymer is performed so as to eliminate or minimize penetration of said polymer into said pores having a pore diameter of about 1 to about 5 nm.

10. The process of claim 2 wherein said substrate material includes pores having a pore diameter of about one nm to about 5 nm and wherein said coating said porous substrate with said polymer is performed so as to eliminate or minimize penetration of said polymer into said pores having a pore diameter of about 1 to about 5 nm.

11. The process of claim 3 wherein said substrate material includes pores having a pore diameter of about one nm to about 5 nm and wherein said coating said porous substrate with said polymer is performed so as to eliminate or minimize penetration of said polymer into said pores having a pore diameter of about 1 to about 5 nm.

12. The process of claim 4 wherein said substrate material includes pores having a pore diameter of about one nm to about 5 nm and wherein said coating said porous substrate with said polymer is performed so as to eliminate or minimize penetration of said polymer into said pores having a pore diameter of about 1 to about 5 nm.

13. The product of claim 5 wherein said substrate material includes pores having a pore diameter of about one nm to about 5 nm and wherein said coating said porous substrate with said polymer is performed so as to eliminate or minimize penetration of said polymer into said pores having a pore diameter of about 1 to about 5 nm.

14. The product of claim 6 wherein said substrate material includes pores having a pore diameter of about one nm to about 5 nm and wherein said coating said porous substrate with said polymer is performed so as to eliminate or minimize penetration of said polymer into said pores having a pore diameter of about 1 to about 5 nm.

15. The product of claim 7 wherein said substrate material includes pores having a pore diameter of about one nm to about 5 nm and wherein said coating said porous substrate with said polymer is performed so as to eliminate or minimize penetration of said polymer into said pores having a pore diameter of about 1 to about 5 nm.

16. The product of claim 8 wherein said substrate material includes pores having a pore diameter of about one nm to about 5 nm and wherein said coating said porous substrate with said polymer is performed so as to eliminate or minimize penetration of said polymer into said pores having a pore diameter of about 1 to about 5 nm.

17. The process of claim 1 wherein said polymer has a molecular weight of greater than about 10,000.

18. The process of claim 1 wherein said polymer has a molecular weight of greater than about 5000 to about 10,000.

19. The process of claim 2 wherein said polymer has a glass transition temperature greater than about 225° C.

20. The process of claim 1 wherein said polymer has a glass transition temperature greater than about 200° C. to about 225° C.

* * * * *